United States Patent [19]

Mahoney

[11] Patent Number: 5,047,710
[45] Date of Patent: Sep. 10, 1991

[54] SYSTEM FOR SCAN TESTING OF LOGIC CIRCUIT NETWORKS

[75] Inventor: John E. Mahoney, San Jose, Calif.

[73] Assignee: Xilinx, Inc., San Jose, Calif.

[21] Appl. No.: 385,856

[22] Filed: Jul. 26, 1989

Related U.S. Application Data

[62] Division of Ser. No. 106,750, Oct. 10, 1987, Pat. No. 4,855,669.

[51] Int. Cl.$^5$ .............................................. G01R 31/28
[52] U.S. Cl. .............................. 324/158 R; 324/73.1; 371/22.3
[58] Field of Search ................. 324/73 R, 73.1, 158 R; 371/22.3, 22.5, 22.1, 25.1

[56] References Cited

U.S. PATENT DOCUMENTS

| | | |
|---|---|---|
| 3,761,695 | 9/1973 | Eichelberger . |
| 3,783,254 | 1/1974 | Eichelberger . |
| 3,784,907 | 1/1974 | Eichelberger . |
| 4,177,452 | 12/1979 | Balasubramania et al. . |
| 4,293,919 | 10/1981 | Dasgupta et al. . |
| 4,494,066 | 1/1985 | Goel et al. ......................... 371/22.3 |
| 4,495,629 | 1/1985 | Zasio et al. . |
| 4,635,261 | 1/1987 | Anderson et al. . |

OTHER PUBLICATIONS

S. Funatsu et al., "Designing Digital Circuit with Easily Testable Consideration", 1978 IEEE Semiconductor Test Conference, pp. 98-102, 1978.
L. A. Stolte et al., "Design for Testability for the IBM System/38", 1979 IEEE Test Conference, Session 2, pp. 29-36, 1979.
Kyushik Son et al., "Design of Programmable Arrays for Testability", 1980 IEEE Conference, Paper 7.2, pp. 163-166, 1980.
Irwin Trichler, "Incomplete Scan Path with an Automatic Test Generation Methodology", 1980, IEEE Test Conference, Paper 7.1, pp. 153-161, 1980.
Y. Arzoumanian et al., "Fault Diagnosis in an LSSD Environment", 1981 IEEE Conference, Paper 4.2, pp. 86-88, 1981.
Mark W. Levi, "CMOS is Most Testable", 1981 IEEE Test Conference, Paper 9.3, pp. 217-220, 1981.
K. S. Dasgupta et al., "A Variation of LSSD and Its Implication on Design and Test Pattern Generation in VLS", 1982 IEEE Test Conference, Paper 3.3, pp. 63-65, 1982.
K. S. Ramanatha et al., "A Design for a Complete Testability of Programmable Logic Arrays", 1982 IEEE Conference, Paper 3.4, pp. 67-74, 1982.
David M. Singer, "Testability Analysis of MOS VLSI Circuits", 1984 IEEE International Test Conference, Paper 21.1, pp. 690-696, 1984.
I. M. Bengali et al., "Diagnostic Devices in Algorithms for Testing Digital Systems", Monolithic Memories Systems Design Handbook, Second Edition, pp. 3-3 to 3-13.
V. J. Coli et al., "High Speed PROMS with on Chip Registers and Diagnostics", Monolithic Memories System Design Handbook, Second Edition, pp. 3-15 to 3-25.
E. H. Frank and R. F. Sproull, "Testing and Debugging Custom Integrated Circuits", 1981, Computing Surveys, vol. 13, No. 4, pp. 425-451.

*Primary Examiner*—Ernest F. Karlsen
*Attorney, Agent, or Firm*—Skjerven, Morrill, MacPherson, Franklin & Friel

[57] ABSTRACT

The integrity of a circuit processing logic signals is verified by use of switching means, including pass transistors, which are selectively varied to provide different test circuit configurations for different modes of operation. The circuit operates in normal, scan, test and data receive modes. During normal operation, the logic signal from the primary circuit is passed directly through a logic test block without the shifting of data in the logic test block.

10 Claims, 10 Drawing Sheets

SYSTEM FOR SCAN TESTING OF LOGIC CIRCUIT NETWORKS

CROSS REFERENCE TO RELATED APPLICATIONS

This said Division of the U.S. application Ser. No. 97/106,750 field Oct. 10, 1987, now U.s. Pat. No. 4,855,669.

BACKGROUND OF THE INVENTION

1. Field of the Invention

This invention relates to a system for scan testing logic circuit networks.

2. Description of the Prior Art

Scan testing is a widely accepted means for functional testing of large scale integrated circuits and very large scale integrated circuits. To implement scan testing a special shift register is usually added to an integrated logic circuit solely for the purpose of functional testing. The special shift register comprises interconnected test blocks which are connected to the logic circuit.

FIG. 1 shows a typical prior art scan testing circuit arrangement including a network of combinational logic circuits 1, 2, 3 ... n. The primary inputs $IN_1$, $IN_2$, ... $IN_n$ to the combinational logic circuitry and the outputs $OUT_1$, $OUT_2$, ..., $OUT_n$ from the combinational logic circuitry remain unchanged, but test blocks 10, 20, 30, ... n0 are connected respectively to the combinational logic circuitry 1, 2, 3 ... n at points which permit surveillance of the functions performed in each logic circuit. The test blocks are interconnected to form a shift register 45 having serial input terminal (scan-in input line) 4 and serial output terminal (scan-out output line) 5. The operation of the combinational logic circuits and the special shift register are generally dependent only upon the digital logic level, and correct operation is not dependent upon the rise time, fall time, or minimum delay of any individual circuit or signal.

Each test block in FIG. 1 has four input lines and one output line. For example, the test block 10 has a primary data input line 13 associated with combinational logic circuit 1, an auxiliary data input line 11, a scan control input line 14, and a clock input line 12. The auxiliary data input line 11 is connected to the scan-in input line 4. The output line 15 of the first test block 10 is connected to the auxiliary data input line 21 of the second test block 20, the output line 25 of the second test block is connected to the auxiliary data input line 31 of the third test block 30, and the output line of each test block is connected to the auxiliary data input line of the next test block up to the last test block n. The output line n5 of the final test block n is tied to the scan-out output line 5.

A scan test consists of two basic parts. The operation of the special shift register 45 comprising the interconnected test blocks 10, 20, 30, ... , n0 is first checked. Then the operation of the logic system is checked. To verify operation of shift register 45 a test vector is scanned through shift register 45. A scan test is used to verify the operation of the logic system. Proper sequencing of the clock signal, scan control signal, test signals, and primary input signals is necessary to perform the scan test. The scan test applies known input signals to combinational logic circuits and then the output signals, generated by the logic circuit in response to the known input signals, are measured. Comparison of the predicted output signals with the measured output signals indicates the functionality of the circuits.

The sequencing of the clock signal, scan control signal, test signals and the primary input signals will depend upon the configuration of the test blocks. A typical test block 10' which requires only a single clock line is shown in FIG. 2. A primary data input line 100 from a combinational logic circuit such as circuit 1, 2, 3, ... , or n of FIG. 1 is connected to a first input terminal of AND gate 120. A first line 101 connects the scan control line 103 to an inverter on the second input terminal of the AND gate 120. The auxiliary data input line 102 and the scan control line 103 are connected to the input terminals of a second AND gate 121. The output line 105 from the AND gate 120 and the output line 106 from the AND gate 121 are connected to the input terminals of OR gate 122. The output line 107 from the OR gate 122 is connected to the input terminal D of the master latch 123. A clock input line 104 is connected to the clock terminal C of the master latch 123 and to an inverter 126. The output line 109 from the master latch 123 is connected to the input terminal D of a slave latch 124. The output line 110 from the inverter 126 is connected to the clock input C of the slave latch 124. The test block output line 111 is connected to the output terminal Q of the slave latch 124.

The normal mode of operation for the test block shown in FIG. 2, requires a low signal on the scan control line 103. With a low signal on the line 103, the output signal of AND gate 121 on the line 106 is always low, and the signal from the inverter on the second input terminal of the AND gate 120 is high. If the signal on input line 100 to AND gate 120 is high, the output signal on line 105 is high, but if the signal on line 100 is low, the signal on line 105 is also low. Thus, the signal on the line 105 follows the signal on the primary input line 100.

The output signal of the OR gate 122 on line 107 follows the signal on the input line 105 because the signal on the other input line 106 to the OR gate 122 is low in the normal mode of operation. Therefore, since the signal of the line 105 follows the signal on the input line 100, the signal on line 107 follows the signal on the input line 100, i.e., the primary input signal is applied to the input terminal D of the master latch 123 in the normal mode of operation.

To pass the input signal on line 107 through the master slave flip-flop 125 to the output line 111, a clock signal is provided on line 104. The signal on line 107 is then passed through the flip-flop 125 to the output line 111. Thus, the user of a circuit which contains this test block must provide a sequence of clock signals to the flip-flop 125 which coincide with the signals on line 100 so that the circuit will function normally. Further, the test block also degrades the circuit's normal performance because it introduces additional delays associated with the switching of the master slave flip-flop 125.

To perform a scan test with the test block 10' of FIG. 2, a high signal is applied on the scan control line 103. This places the test block in the scan mode. In this mode, any signal applied on line 102 is present on the input line 107 of the master latch 123 and when a clock pulse is provided on line 104 the input signal is loaded into the flip-flop 125 and available on the output line 111. After this sequence of operations the test block is in the test mode because a known test signal is available on the output line 111 which is connected to an input line of the logic circuit under test. To determine the results of applying a known input signal to the logic circuit under test the logic circuit is given time to stabilize and then the data receive mode is used.

In the data receive mode, the high logic signal on the scan control line 103 is switched to a low logic level. As described previously, for a low signal on the scan control line 103, the signal on the input line 100 is applied to the input terminal D of the master latch 123. Thus, if the line 100 is connected to the output line of a logic circuit under test, the test output signal is available to the input terminal D of the master latch. Application of a clock pulse on the clock input line 104 stores the test output signal in the flip-flop 125.

Next the signal on the scan control line 103 is again switched to a high signal, and a sequence of clock pulses is applied to shift the stored test signals out of the shift register 45 comprised of the interconnected test blocks, as shown in FIG. 1.

The implementation of this prior art scan technique requires that the flip-flops in each test block remain in the normal signal path of the combinational logic circuit network even after the test is completed. The extra circuitry introduces timing delays as well as the need for clock pulses to pass the normal circuit logic signal through the latches.

While other prior art test blocks are used in scan testing, these other test blocks also require that the normal combinational logic circuit output signals pass through one or more flip-flops before the signals are available to the next portion of the combinational logic circuitry. This requires sequencing of one or more clock pulses to the flip-flops during normal operation of the combinational logic circuitry. The user must not only understand the general logic circuit but also the interaction of the test blocks with the circuits. A malfunction of the flip-flop in a test block under normal operation will directly affect the output signal from the combinational logic circuitry.

Another prior art system 150 for scan testing of logic circuits is shown in FIG. 3. The normal output lines 180 from the logic circuit under test are a first set of input lines to a multiplexer 191. The multiplexer output lines 184 are the input lines to a group of output registers 192 controlled by line 187. The output lines 185 from the output registers 192 are the output lines for the logic circuit. The lines 186 are connected to the output lines 185 and to the inputs of the scan register 190. The scan register 190 also has a clock input line 181, scan-in input line 182, a mode control input line 183, a scan-out output line 193, and a set of output lines 188, which are a second set of input lines to the multiplexer 191. The scan register 190 is basically a register with shift capability. The mode control input line 183 is also connected to the multiplexer 191.

This system has some advantages over the other prior art scan testing systems because the normal signal path through this system requires only that the signal on the mode control line be set so that the multiplexer passes the signals on the input lines 180 to the output lines 184. Hence, the user is not required to sequence clock pulses with the normal signals from the logic circuit under test to pass the normal logic circuit signals through the scan testing system. Also, a test vector may be loaded into the scan register while the normal signals from the circuit are passed through the scan system.

However, this system requires additional hardware and the system still permits only a high degree of fault coverage. Therefore, the prior art scan testing systems while assisting in determining the functionality of a logic circuit are difficult for the user to use and introduce additional failure modes which may not easily be checked or verified by the user.

SUMMARY OF THE INVENTION

In accordance with my invention I solve the problems of the prior art by providing a primary test circuit incorporating at least one logic test block for verifying the functionality of the primary circuit. Logic test blocks incorporated in the primary circuit are transparent to the user during normal operation of the primary circuit, but yet the logic test blocks provide the capability for complete scan testing of the primary circuit. Further, each logic test block is designed such that every function performed by the logic test block may be tested so as to verify correct operation of the logic test block. Each logic test block comprises a plurality of switching elements that enable a multiplicity of modes of operation of the primary circuit.

The logic test block of this invention has a primary input terminal, a scan-in input terminal, an output terminal, a scan-out output terminal and a scan clock input terminal. The primary input terminal is connected to the output terminal by a first switch means. The scan-in terminal is connected to the input terminal of a data storage means by a second switch means, while the scan-out output terminal is connected to the output terminal of the data storage means. The scan clock input terminal is connected to the clock terminal of the data storage means. A third switch means connects the primary input terminal to the input terminal of the data storage means and a fourth switch means connects the logic test block output terminal to the output terminal of the data storage means.

This novel logic test block is inserted into each primary circuit line where it is desired to verify the logic signal. The primary circuit line is effectively separated producing two ends. A first end of the primary circuit line is connected to the input terminal of the logic test block while the second end of the primary circuit line is connected to the output terminal of the logic test block.

The scan-in and scan-out terminals of the logic test blocks incorporated in the primary circuit are interconnected to form a shift register. The logic test blocks may function in either the normal, scan, test, or data receive modes.

A novel feature of the invention is that during normal operation the first switch means and the third switch means are closed while the second switch means and the fourth switch means are open. Hence, the primary circuit's logic signal is passed from the primary input terminal through the first switch means to the output terminal of the logic test block. The user of the primary circuit does not have to be concerned with shifting data through the logic test block during normal operation. Rather, the signal from the primary circuit is passed directly through the logic test block in its normal configuration.

To perform the scan testing the switch means in the logic test blocks incorporated in the primary circuit are opened and closed in predetermined sequences. Clock pulses are applied to shift data into and out of the logic test block's data storage means. Using scan testing, the user can verify the functionality of the primary circuit.

During the scan testing, the first switch means in the logic test blocks will be open, so that the signals may be appropriately transferred through the data storage means from either the primary input terminal or the scan-in input terminal. However, the scan testing also verifies the functionality of the first switch means because of the unique layout of the first switch means. In one embodiment, the first switch means is a transistor which shares its diffusion regions with other transistors, whose integrity is verified by scan testing. Also, the gate of the transistor is part of a serial line, which includes the gates of similar transistors in other logic test blocks. The serial line is designed to permit easy verification of its integrity. The unique layout of the transistor permits the 100% functional testing and verification of operability of the logic test block.

Finally, this invention permits the user to monitor the logic signals in the primary circuit while the primary circuit is operating in its normal mode.

DETAILED DESCRIPTION OF THE INVENTION

Figure 4A:
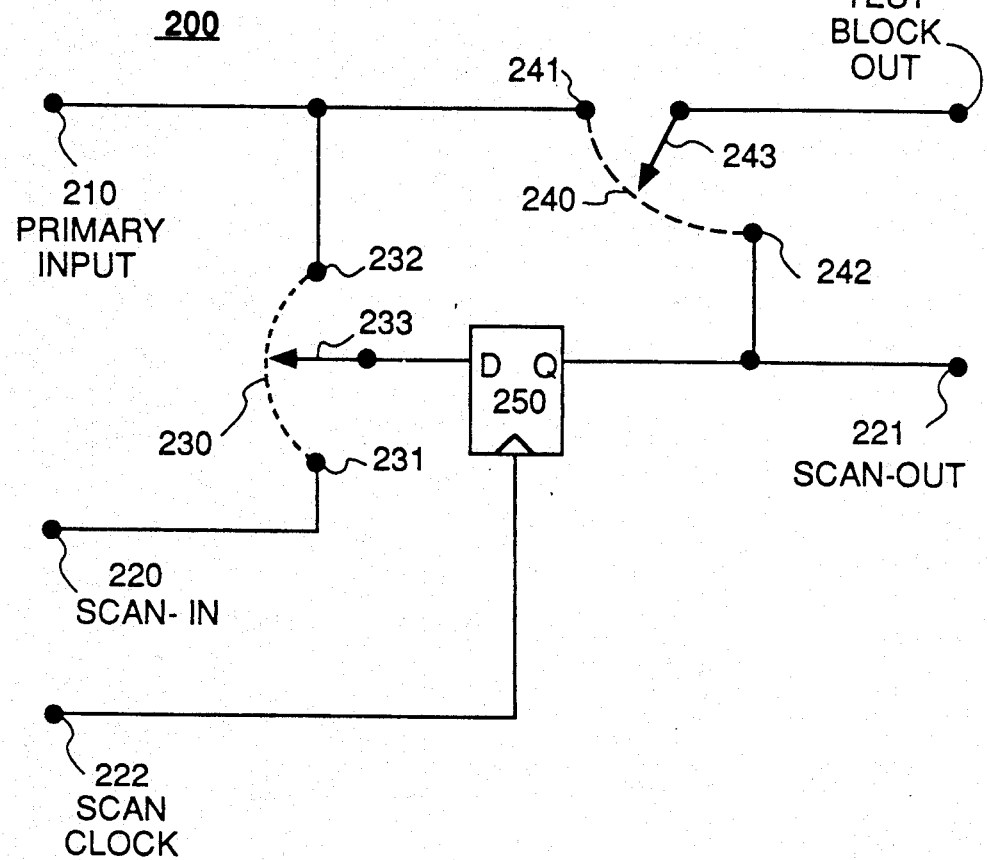
FIG. 4A is a representational diagram of the scan logic test block of this invention.
Figure 4B:
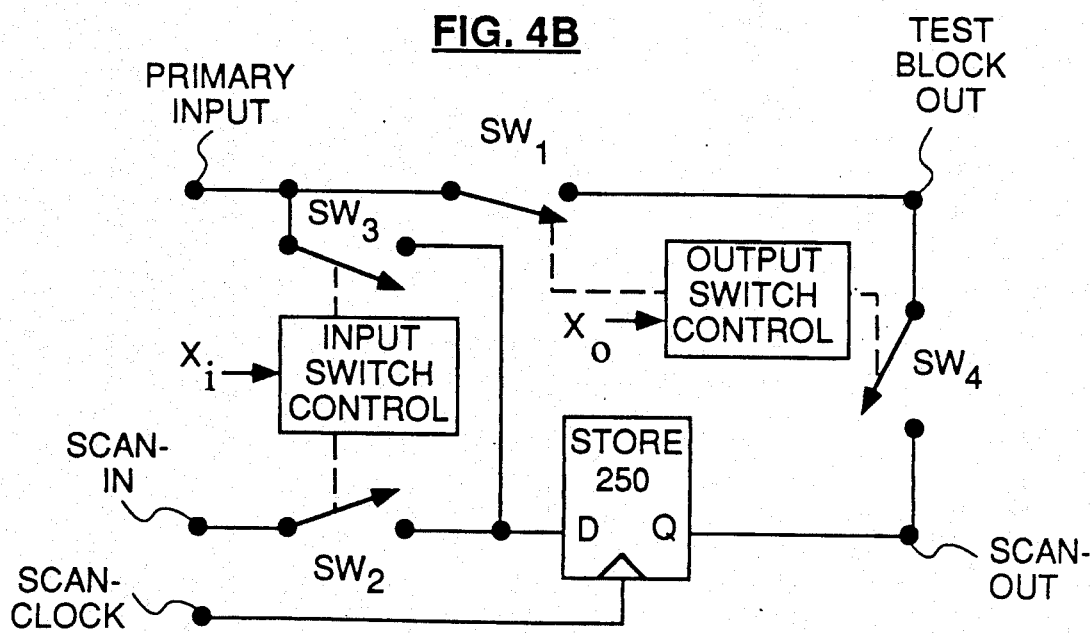
FIG. 4B is a block diagram of another embodiment of a scan test in accordance with the invention.

FIG. 4A is a conceptual representational diagram of one logical test block of this invention. Conceptually, a logic test block 200 is comprised of two single pole double throw switches, a data storage means and lines interconnecting the switches, the data storage means and the logic circuit containing the logic test block. A first input line 210 of the logic test block 200 is connected to both the second terminal 232 of a first single pole double throw switch (input switch) 230 and to the first terminal 241 of a second single pole double throw switch (output switch) 240. A second input line, the scan-in input line, 220 is connected to the first terminal 231 of the first single pole double throw switch 230. The selector 233 of the first single pole double throw switch 230 is connected to the input terminal of a clocked flip-flop 250. The scan clock input line 222 is connected to the clock terminal of the data storage means, a flip-flop 250. The output terminal of the flip-flop 250 is connected to both a second terminal 242 of the second single pole double throw switch 240 and the scan-out output line 221 of the logic test block. The selector 243 of the second single pole double throw switch 240 is connected to the logic test block output line 211.

The logic test block of my invention as shown in FIG. 4A functions in the four modes, i.e., normal, scan, test, and data receive modes. The logic test block may be configured to perform some of these functions simultaneously. In the normal mode of operation the selector 233 of input switch 230 is either in contact with terminal 231 or left in the open position. The selector 243 of output switch 240 is connected to terminal 241. In this mode, the signal on primary input line 210 passes through output switch 240 to the test block output line 211 of the logic test block 200. The output of flip-flop 250 is isolated from the output line 211 and the input line 210. Hence, unlike the prior art, in the normal mode of operation the functionality of the logic test block's flip-flop 250 will not affect the operation of the circuit to which the logic test block is connected.

In the scan mode, data is shifted into and out of the logic test block's flip-flop 250. In the scan mode, the selector 233 of input switch 230 is connected to the terminal 231 while the selector of output switch 240 may be connected to terminal 241, terminal 242 or left in the open position If the selector 243 is connected to terminal 241, a signal may be loaded into the flip-flop 250 without disturbing the normal functioning of the circuit in which the logic test block is located. During the scan mode, clock pulses are applied on the line 222 to shift data into and out of the flip-flop 250.

In the test mode, the signal stored in the flip-flop 250 is used to provide a known signal on the test block output line 211. Therefore, the selector 243 of output switch 240 is connected to terminal 242 and the signal on the output terminal of the flip-flop 250 is available on both the test block output line 211 and the scan-out output line 221. In the test mode, the selector 233 of input switch 230 may be connected to terminal 232, terminal 231, or left in the open position In the scan test data receive mode, the signal, which is being tested on the primary input line 210 is stored in the flip-flop 250. Therefore, the selector 233 of the first single pole double throw switch 230 is connected to the terminal 232. The selector 243 of the second single pole double throw switch 240 is connected to the terminal 242 since the data in flip-flop 250 is providing one of the stimuli for the test. A clock pulse is applied on the scan clock line 222 to load the signal being tested on the primary input line 210 into the flip-flop 250.

In addition to the scan test modes, the logic test block 200 can also be configured by selected switch positions to permit real time measurements of signals. For example, the selector 233 of input switch 230 is connected to terminal 232 while the selector 243 of output switch 240 is connected to terminal 241. In this configuration, the signal on the primary input line 210 passes through output switch 240 to the test block output line 211, but the signal on the primary input line 210 also passes to the input terminal of the flip-flop 250 through input switch 230. On the application of a clock pulse on the scan clock input line 222, the signal on the primary input line 210 is loaded into flip-flop 250 and then scanned out on line 221. Therefore, in this configuration, the signal on the primary input line 210 at the time the scan clock pulse is applied, is stored in the flip-flop 250 without interrupting the normal function of the circuit in which the logic test block is contained.

Figure 1:
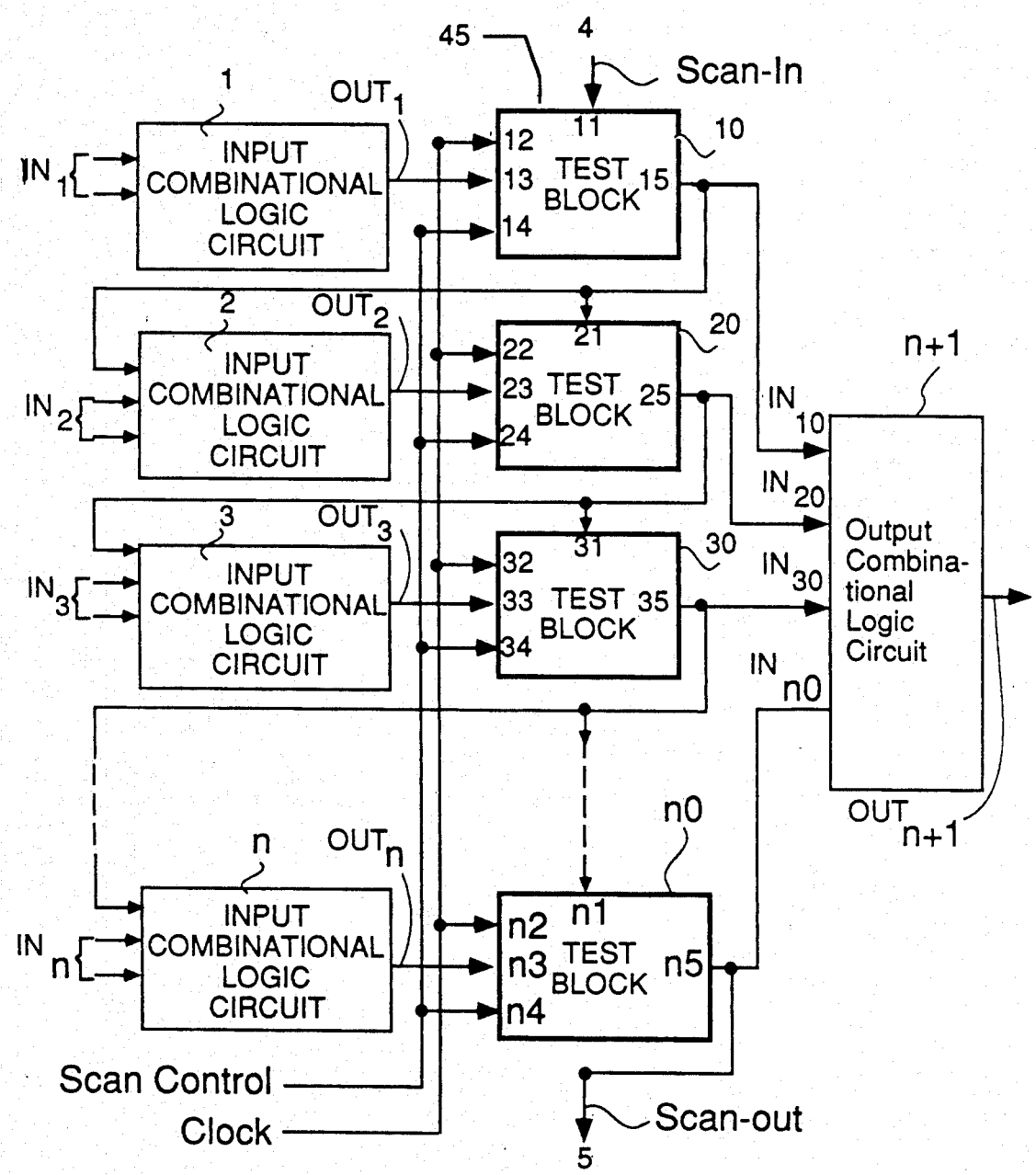
FIG. 1 illustrates a prior art scan test circuit.
Figure 2:
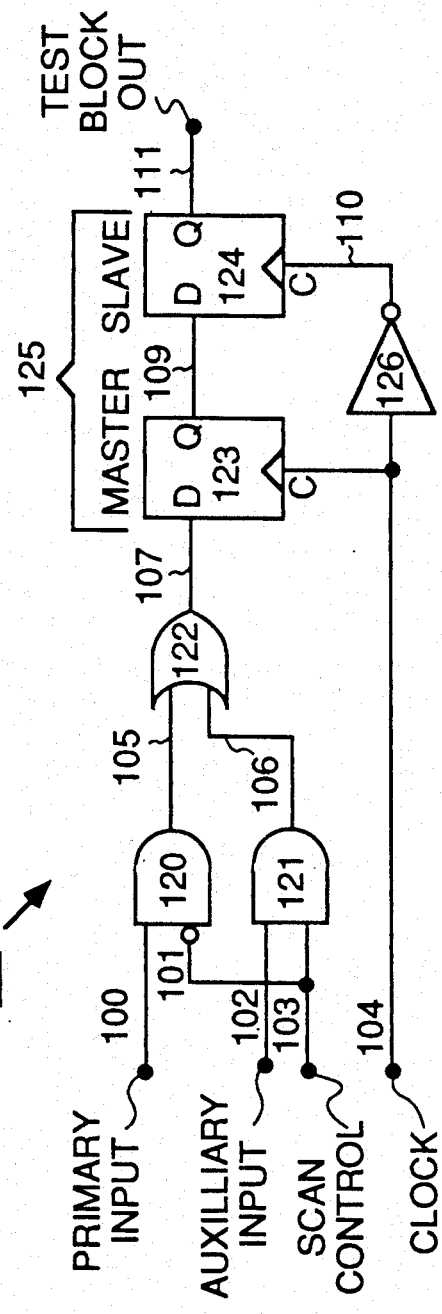
FIG. 2 illustrates a prior art scan logic test block which uses on a s clock.
Figure 3:
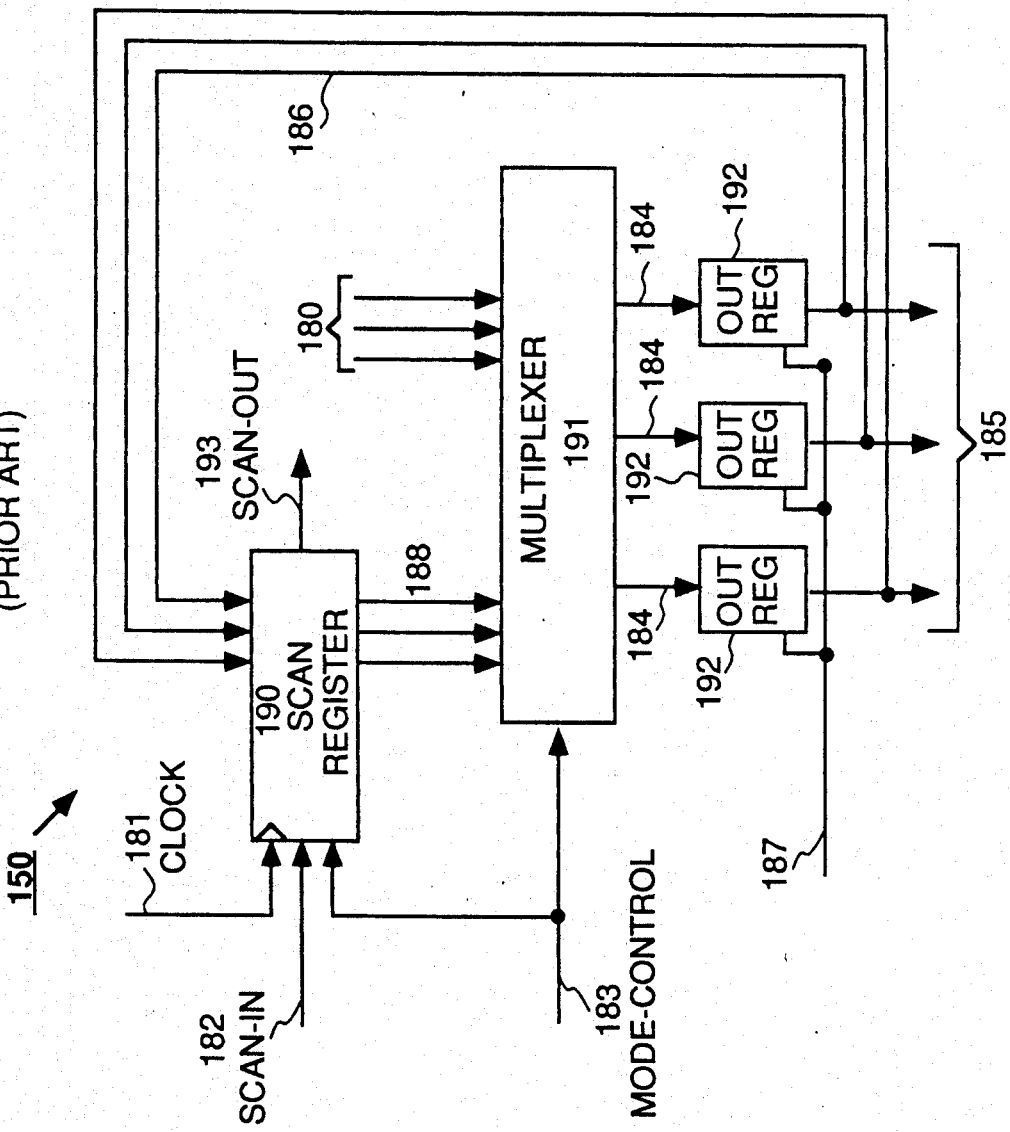
FIG. 3 illustrates another prior art scan test circuit.

In yet another configuration formed by the switches, the logic test block 200 performs a function equivalent to that of the normal mode of operation of the prior art logic test block in FIG. 2. For this function, the selector 233 of the input switch 230 is connected to the terminal 232 and the selector 243 of the output switch 240 is connected to terminal 242.

In this selected configuration, the signal on the primary input line 210 is passed through input switch 230 to the input of the flip-flop 250, but the signal on the primary input line 210 is not passed through the output switch 240 to the test block output line 211 because the selector 243 of output switch 240 is in contact with terminal 242. Hence, to pass the primary input signal to the test block output line 211, a clock pulse has to be applied on scan clock line 222. In this configuration, the logic test block 200 is therefore functionally equivalent to the normal mode of operation of the prior art circuit 10' in FIG. 2.

To perform a scan test, the logic test block 200 of FIG. 4A or a multiplicity of such logic test blocks are placed in a logic circuit. Typically, the logic test blocks are utilized in a combinational logic circuit. The combinational logic circuit is comprised of combinational logic blocks (CLBs) wherein each CLB has a specified number of input and output lines. A logic test block is normally placed in each output line of the CLBs. Each CLB output line in which a logic test block is placed is effectively separated producing two ends. A first end is connected to the primary input line 210 of the logic test block and the second end to the test block output line 211. For each group of CLBs which are mutually independent from other CLBs, the scan-in input line and the scan-out output line of the logic test blocks are interconnected to form a shift register.

To perform the scan test, the functionality of the shift register is verified by placing each of the logic test blocks comprising the shift register in the scan mode. Then a known sequence of signals is applied to the scan-in input line of the first logic test block in the shift register and clock pulses are applied to shift these signals through the shift register. The output signal on the scan-out output line of the last logic test block in the shift register is checked. Comparison of the input signals to the output signals reveals the functionality of the shift register.

After the functionality of the shift register is verified, a known test vector is loaded into the logic test blocks while they are in the scan mode. Then the selector 243 of the output switch 240 is set to the terminal 242 in each logic test block of the shift register. This puts the logic test blocks in the test mode. The signal stored in the flip-flop 250 is then available on both the test block output line 211 and the scan-out output line 221. Since the test block output line 211 of each logic test block is connected to an input line of the logic circuit, the test vector is applied to the input lines of the logic circuit.

After the logic circuit under test has stabilized, the selector 233 of the input switch 230 in each logic test block comprising the shift register is set to the terminal 232. This puts the logic test blocks in the data receive mode and the signal on the primary input line 210 of each logic test block is clocked into its flip-flop 250 by the application of a clock pulse. Next the logic test blocks are placed in the scan mode by placing the selector 233 of the input switch 230 in contact with the terminal 231. A series of clock pulses is applied and the signal on the scan-out line of the last logic test block in the shift register is checked and compared with the signal expected from the combinational logic block to determine its functionality.

Figure 5:
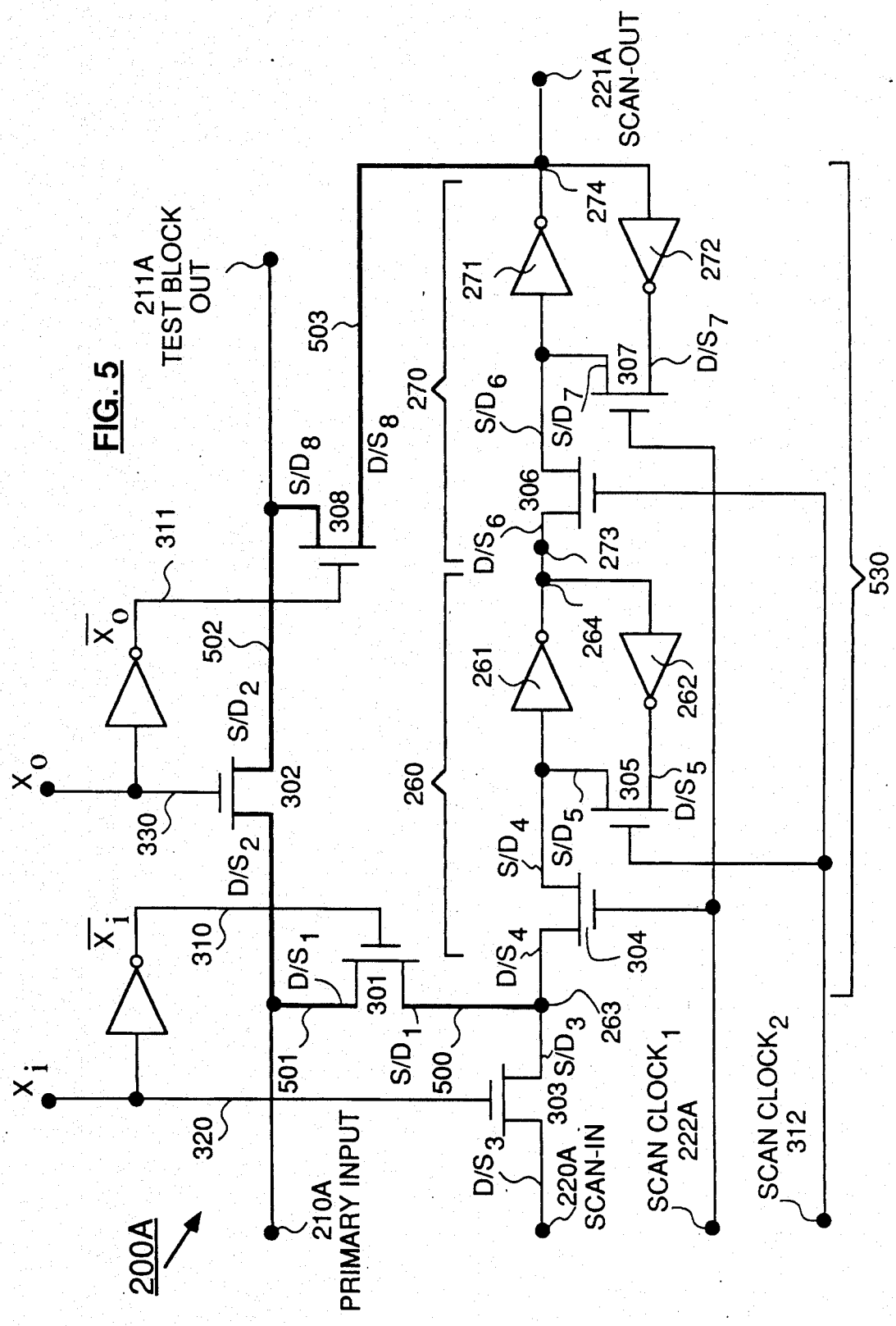
FIG. 5 is a schematic circuit diagram of an embodiment invention.

Thus, the novel logic test block of my invention provides a means for scan testing. To further illustrate the novelty of the logic test block, a specific embodiment 200A of the logic test block is shown in FIG. 5. The primary input line 210A is connected to both a drain/source region $D/S_1$ of a first pass transistor 301 and a drain/source region $D/S_2$ of a second pass transistor 302. Since the pass transistors in FIG. 5 are symmetric, the designation of source and drain is not important because the transistors pass a signal from the source to the drain or from the drain to the source when a voltage greater than the threshold voltage is applied. Therefore, the first terminal of the transistor is denoted the drain/source (D/S) and the second terminal is denoted the source/drain (S/D).

The scan-in input line 220A is connected to the drain/source $D/S_3$ of a third pass transistor 303. The source/drain $S/D_3$ of the pass transistor 303 is connected to both the source/drain $S/D_1$ of the pass transistor 301, and the input terminal 263 of a first latch 260 ($D/S_4$). A first control line 320 is connected to the gate of the pass transistor 303. A second control line 310, which supplies the complement of input control signal $X_i$ on line 320, is connected to the gate of the pass transistor 301.

The source/drain $S/D_2$ of the pass transistor 302 is connected to the logic test block output line 211A. The source/drain $S/D_8$ of a fourth pass transistor 308 is also connected to the logic test block output line 211A. The drain/source $D/S_8$ of the pass transistor 308 is connected to the output line 274 of second latch 270. A third control line 330 is connected to the gate of the pass transistor 302. A fourth control line 311, which carries the complement of the output control signal $X_o$ on line 330, is connected to the gate of the pass transistor 308.

The first latch 260 is comprised of two inverters 261, 262 and two pass transistors 304, 305. The drain/source $D/S_4$ of the pass transistor 304 is connected to the latch input line 263, while the source/drain $S/D_4$ of the pass transistor 304 is connected to both the input terminal of the inverter 261 and the source/drain $S/D_5$ of the pass transistor 305 in the latch 260. The output terminal of the inverter 261 is connected to both the output line 264 of the first latch 260 and the input terminal of the second inverter 262 in the latch 260. The output terminal of the inverter 262 is connected to the drain/source $D/S_5$ of the second pass transistor 305 while the source/drain $S/D_5$ of pass transistor 305 is connected to the input terminal of the inverter 261. One scan clock input line 222A is connected to the gate of the pass transistor 304. Another scan clock line 312, which carries a non-overlapping complement signal (SCAN $CLK_2$) of the signal (SCAN $CLK_1$) on the first scan clock input line 222A, is connected to the gate of the pass transistor 305. In other words, the signal on line 312 will be low when the signal on line 222A is high and high when the signal on 222A is low.

The output line 264 of the first latch 260 is connected to the input line 273 of a second latch 270. The latch 270 is also comprised of two inverters 271, 272 and two pass transistors 306, 307. The drain/source $D/S_6$ of the pass transistor 306 is connected to the latch input line 273. The source/drain $S/D_6$ of the pass transistor 306 is connected to both the input terminal of a first inverter 271 and the source/drain $S/D_7$ of the pass transistor 307 in the latch 270. The output terminal of the first inverter 271 is connected to both the output line 274 of the latch 270 and the input terminal of the second inverter 272 in the latch 270. The output terminal of the inverter 272 is connected to the drain/source $D/S_7$ of the second pass transistor 307 while the source/drain $S/D_7$ of pass transistor 307 is connected to the input terminal of the inverter 271. The scan clock line 312 is connected to the gate of the pass transistor 306. The gate of the other pass transistor 307 is connected to the other scan clock input line 222A.

For normal operation, a high signal is present on line 330 and line 320 ($X_i=H$, $X_o=H$). Since the signal on the line 311 is the complement of the signal on the line 330, the signal on the line 311 is low. Similarly, the signal on the line 310 is the complement of the signal on the line 320 and so the signal on the line 310 is also low.

The term "high signal" means a voltage such that when the voltage is applied to the gate of the pass transistor, the signal on the drain/source of the pass transistor is passed to the source/drain of the pass transistor, whereas a low signal means a voltage that is not sufficient when applied to the gate of a pass transistor to pass the signal on the drain/source of the pass transistor to the source/drain of the pass transistor.

The high signal ($X_o=H$) on the line 330 drives the gate of the pass transistor 302 high. The pass transistor 302 then passes the input signal on the primary input line 210A to the the test block output line 211A. The signal on the latch 270 output line 274 does not pass to the test block output line 211A, since the signal on the line 311 is low and the pass transistor 308 does not conduct. Also, the pass transistor 301 does not pass any signal present on its drain/source $D/S_1$ from the primary input line 210A because the signal on the line 310 is low.

The high signal on the line 320 drives the gate of the pass transistor 303 high and the signal on the drain/source $D/S_3$ of the pass transistor 303 from the scan-in input line 220A is passed to the input line 263 of the latch 260. However, the signal on the first scan clock input line 222A is low during normal operation. Thus, the gate of the pass transistor 304 in the latch 260 is low and the pass transistor 304 does not pass the signal on the line 263 to the inverter 261. During normal operation, the state of the latch 260 is not of interest since no signal is being passed to it, and similarly the signal on the scan-out output line 221A is not of interest.

Notice that in the normal mode, the latches 260, 270 in the logic test block 200A are transparent to the user. The signal on the input line 210A passes to the output line 211A without any additional actions in or on the logic test block. No clock pulses are required by the logic test block and no gate or data storage devices are required to function as in the prior art.

Another unique feature of the logic test block 200A is that it can be configured for the normal mode and the scan mode of operation simultaneously. The signal path from the scan-in input line 220A through the pass transistor 303, latch 260 and the latch 270 to the scan-out output line 221A is isolated from the normal signal path consisting of input line 210A, the pass transistor 302 and the output line 211A. Further, the pass transistor 303 is typically on in the normal mode and consequently all that is necessary to scan data into the logic test block is to provide a signal on the scan-in input line 220A in combination with an appropriate sequence of clock pulses on lines 222A and 312. The clock pulses on the clock lines 222A and 312 must be non-overlapping in this embodiment to assure proper operation of the master slave flip-flop 530 formed by latches 260 and 270.

In the scan mode, a high signal is applied on line 320 ($X_i=H$). Thus, the scan-in signal on the scan-in input line 220A is first passed by the pass transistor 303 to the input line 263 of the latch 260. Then, when the signal on the scan clock input line 222A goes high, the scan-in signal on the input line 263 of the latch 260 is passed by the pass transistor 304 to the inverter 261 and the complement of the scan-in signal is output from the inverter 261 to the input line 273 of latch 270. The complement of the scan-in signal from the inverter 261 also goes to the input of the inverter 262, which inverts the signal back to the original scan-in signal, but the pass transistor 305 does not pass the signal from the output of the inverter 262 back to the input of the inverter 261 because the signal on second clock line 312 is low.

The high signal on the scan clock input line 222A also drives the gate of the pass transistor 307 in the latch 270 high, but the gate of the pass transistor 306 is low because the signal on the second clock line 312 is low. Thus, the pass transistor 306 will not pass the signal on the input line 273 and the remainder of the circuit of latch 270 is isolated from the input line 273. The high level on the gate of the pass transistor 307 passes the signal from the output of the inverter 272 to the input of the inverter 271. Thus, the latch 270 latches on the signal which was present on the latch 270 input line 273 prior to the initiation of the high signal on the scan clock input line 222A and the complement of the input signal is maintained on the latch output line 274 while data is scanned into the latch 260.

When the signal on first scan clock input line 222A returns to the low state the gate of the pass transistor 304 in the latch 260 goes low and the remainder of the circuitry of the latch 260 is isolated from the input signal on the scan-in input line 220A because the pass transistor 304 does not pass a signal. The gate of the pass transistor 305 is driven high by the signal on the line 312 which goes high after the signal on the scan clock input line 222A returns to the low level. With the gate high, the pass transistor 305 passes the signal from the output of the inverter 262 to the input of the inverter 261. Thus, the latch 260 latches on the signal that was present on the latch input line 263 at the initiation of the high signal on the scan clock input line 222A and the complement of the input signal is maintained at the latch output line 263 while the data is scanned into the latch 270.

After the clock signal on the first scan clock input line 222A goes low, the high signal on the second clock line 312 also drives the gate of the pass transistor 306 in the latch 270 high. Thus, the pass transistor 306 passes the signal on the input line 273 to the input of the inverter 271. However, the gate of the pass transistor 307 follows the signal on the first scan clock input line 222A and goes low, and consequently the output of the inverter 272 is no longer passed by the pass transistor 307 to the input of the inverter 271. Hence, the inverter 271 acts as an output driver for the scan-out output line 221A. This demonstrates that in the scan mode a clock pulse on the scan clock input line 222A, i.e. the signal on the line 222A goes from low to high and back to low, loads the signal on the scan-in input line 220A into the latch 260 and the latch 270 acts as output driver and provides the scan-in input signal level to the scan-out output line 221A. Thus, the scan-in is complete.

After loading a known signal into the logic test block during scan-in, the logic test block is placed in the test mode by changing the signal on line 330 to a low level ($X_o=L$) and the signal on line 311 to a high level. Consequently, pass transistor 302 no longer passes the signal on the primary input line 210A to the test block output line 211A, but pass transistor 308 passes the signal loaded in the latches 260, 270 during scan-in to the test block output line 211A. Hence, during the test mode of known signal is applied to the circuit to which the test block output line 211A is attached.

After the change to the test mode and after the circuit under test has stabilized, the signal on line 320 is switched to a low level ($X_i=L$) and the signal on line 310 to a high level. This change turns pass transistor 301 on and pass transistor 303 off and places the logic test block in the data receive mode. Therefore, any signal present on the primary input line 210A during the test mode can be loaded in the latches by use of scan clock pulses as described in the scan-in.

After the test signals have been applied and results loaded into the appropriate logic test blocks, the logic test blocks are returned to the normal configuration. In this configuration, the application of scan clock pulses scans the data out of the logic test block in a manner equivalent to that described in the scan-in.

Figure 6A:
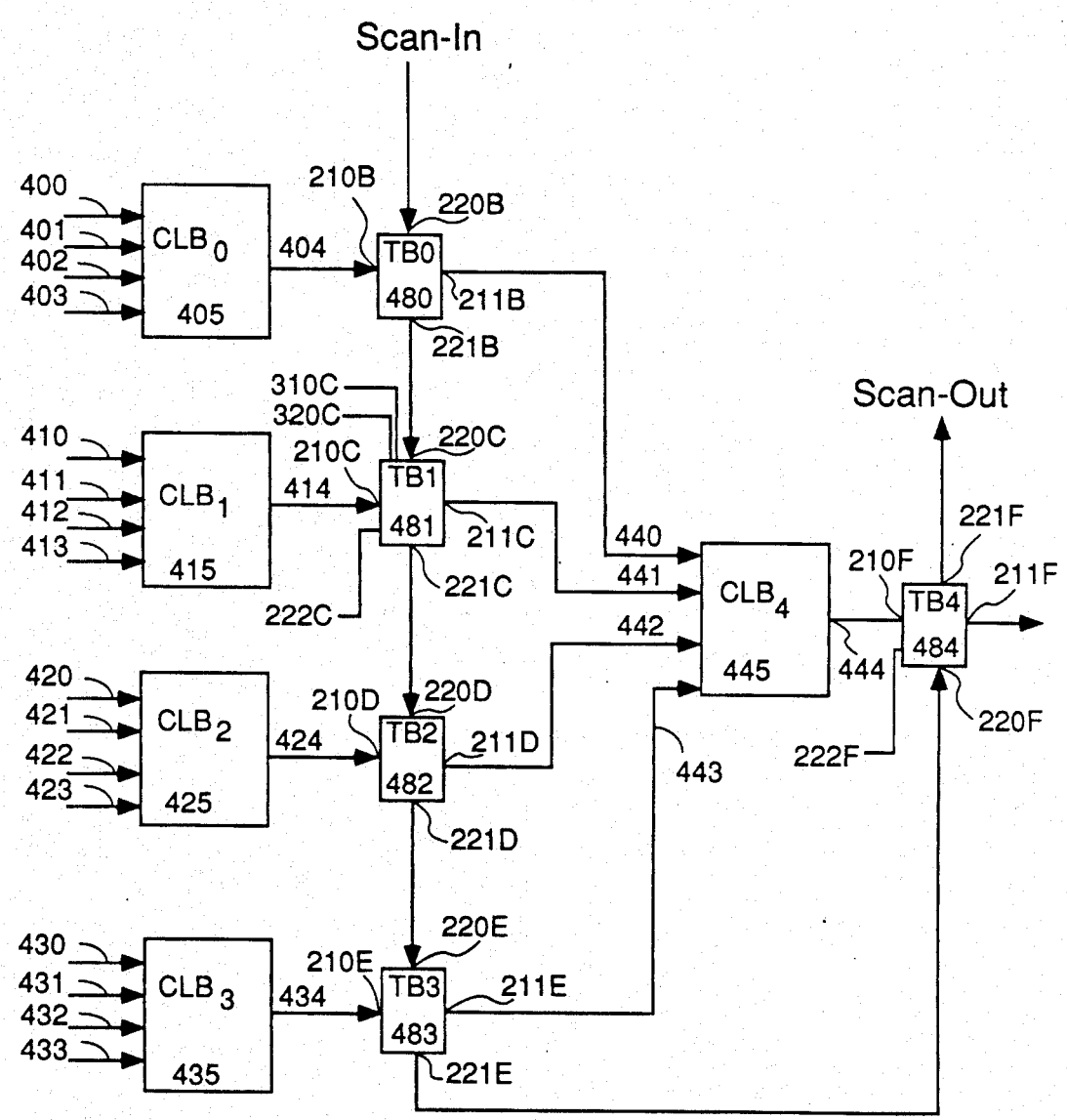
FIG. 6a is a block circuit diagram of an implementation of the novel scan logic test block in a combinational logic circuit so as to permit scan path testing of the combinational logic circuit.

FIG. 6a depicts the logic test block of this invention incorporated in a combinational logic block circuit 300. The circuit 300 in FIG. 6a includes five combinational logic blocks 405, 415, 425, 435, and 445, (also denoted as $CLB_0$ through $CLB_4$) and five logic test blocks 480-484 of the type shown in FIG. 4A (also denoted as $TB_0$ through $TB_4$). The output lines 404, 414, 424, 434 from each of the four combinational logic blocks 405, 415, 425, 435 are connected to respective primary input lines of logic test blocks 480, 481, 482, 483. The test block output lines 211B, 211C, 211D, 211E, of the logic test blocks 480, 481, 482, 483 serve as input lines 440-443 respectively to the fifth combinational logic block 445. The scan-in line and scan-out lines of each logic test block (TB0 through TB4) are interconnected to form one continuous shift register.

The combinational logic blocks 405, 415, 425, 435 are identical in structure in that each has four input lines and one output line, but yet the function performed by each CLB may be different. Therefore, a description of block 405 input and output lines will encompass the structure and operation of the other combinational logic blocks' input and output lines as shown in FIG. 6a. The combinational logic block 405 has four input lines 400-403. The function performed by the combinational logic block 405 is represented by the signal on the CLB output line 404. The CLB output line 404 is connected to the primary input line 210B of the first logic test block 480. The output line 11B from the logic test block is the first CLB input line 440 for combinational logic block 445.

The scan-in input line 220B of the logic test block 480 is coupled to a source (not shown) which supplies scan-in test signals. The scan-out output line 221B of logic test block 480 is connected to the scan-in input line 220C of the next logic test block 481. The scan-out output line 221C from logic test block 481 is connected to the scan-in line 220D of logic test block 482 and each of the remaining logic test blocks are similarly connected. The scan-out output line 221F of the fifth logic test block 484 is coupled to circuitry (not shown) which allows measurement of the signal on the line 221F.

In an actual application, the scan-out output line 221F of the logic test block 484 and the scan-in input line 220B of the logic test block 480 may be connected to other logic test blocks which form a larger shift register.

Therefore, the coupling discussed for the shift register in FIG. 6a is illustrative only and is not intended to limit the general use of the logic test blocks in a shift register which is interconnected with a multiplicity of combinational logic circuits such as that shown in FIG. 6a.

Each of the logic test blocks in FIG. 6a also has a scan clock input line and four control lines such as 320, 310, 330, 311 to the pass transistors, as shown in FIG. 5. However, for clarity these lines are not shown in FIG. 6a. The simple circuit in FIG. 6a is illustrative of one application. The specific number of combinational logic blocks, number of input lines to each combinational logic block, the number of output lines from each combinational logic block, and the interconnections of the logic test blocks that form the shift register are illustrative only. Any number or combination of combinational logic blocks and any number of input and output lines can be used to implement the invention. The only restriction is that the CLBs comprising a test circuit, as defined by the logic test blocks interconnected to form a shift register, must be mutually independent from the other CLBs that comprise the complete combinational logic circuit.

Initially, the circuit in FIG. 6a is operating in the normal mode. Referring again to FIG. 5, this means that in each logic test block in FIG. 6a, a high signal is present on lines 330 and 320 while a low signal is present on lines 310 and 311. In this configuration, the latches in the logic test block are isolated from the normal signal path through the logic test block. Consequently, the logic test block is ready for data to be scanned into the latches by the application of signals on the scan-in input line and the application of clock pulses.

Typically, several test vectors are used to test a combinational logic circuit. The generation of the test vectors and the appropriate sequencing of scan clock pulses can be accomplished manually, but for any reasonably sized combinational logic circuit, the number of sequences that must be analyzed is so large that manual generation is not practical. Rather, a microprocessor utilizing either software or data files used to design the combinational logic circuit is used to generate the appropriate test vectors.

However, for illustrative purposes assume that a test vector which corresponds to a high signal on the input line 440, the input line 441, and the input line 443 and a low signal on the input line 442 to the combinational logic block 445 is used to test the combinational logic block 445.

Figure 6B:
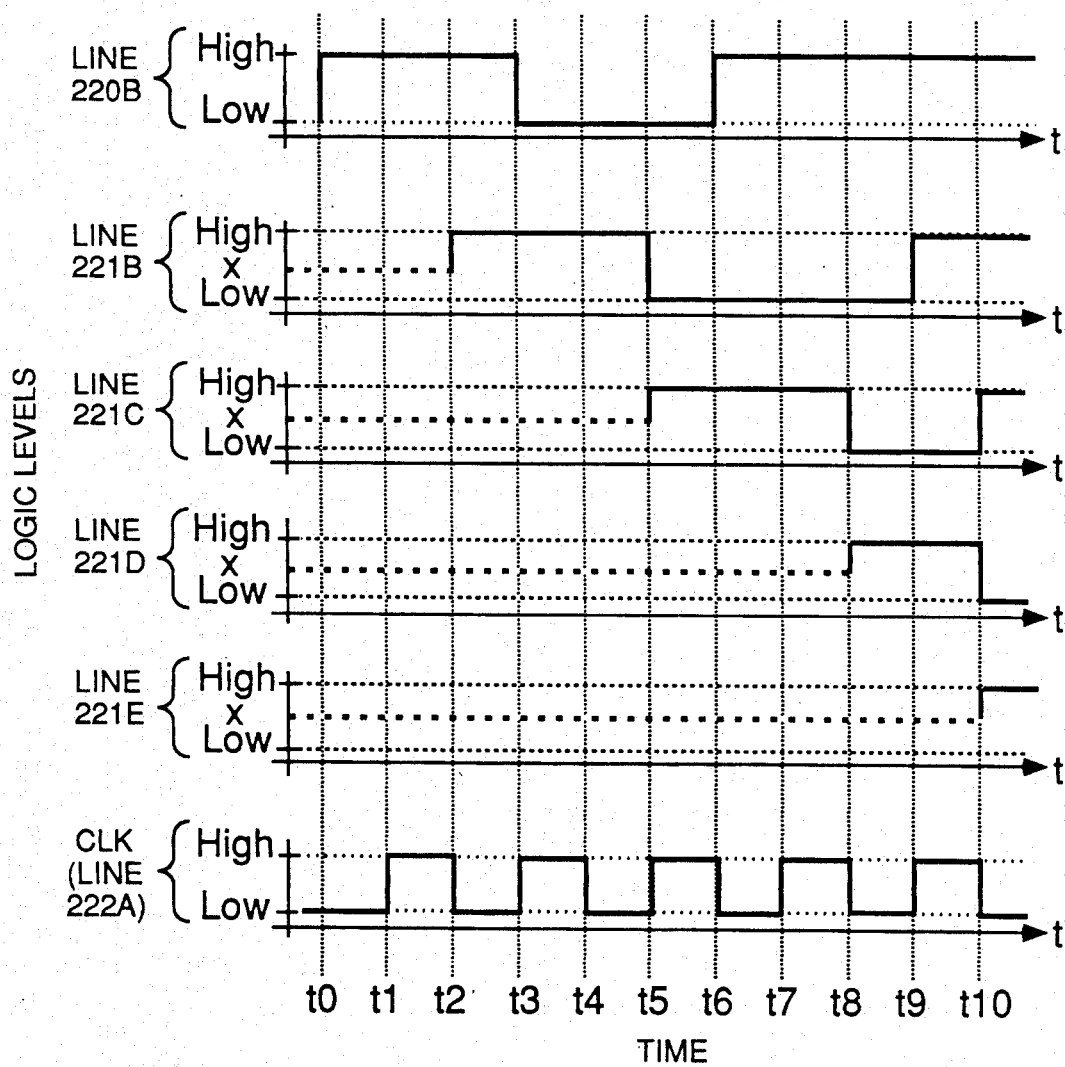
FIG. 6b illustrates the signal levels during loading of a test vector into the logic test blocks.

Initially, the signal stored in the latch of each logic test block of combinational logic is unknown. In FIG. 6b, the signal stored in the logic test block is represented by a dashed line until the signal is known. To start the test vector scan-in, a high logic signal is applied to the scan-in input line 220B. As shown in FIG. 6b, a first clock pulse is then supplied to each logic test block for the period $t_1-t_2$. In FIG. 6b, the signal on the clock line (222A) is shown. The signal on line 312 (FIG. 5) will be low when the signal on line 222A is high and high when the signal on 222A is low. In this embodiment, care must be taken in switching the signals on clock lines 222A and 312 to assure that the edges of the clock pulses on the lines do not overlap in time.

At the end of the first clock pulse, at $t_2$, the signal on the scan-out output line 221B of the logic test block 480 is high while the output signal from the remaining logic test blocks is still unknown. At the time $t_3$, the signal on the scan-in input line 220B of the logic test block 480 is switched to a low logic level and another clock pulse is applied to each logic test block for a period $t_4$-$t_5$. At $t_5$, the signal on the scan-out output line 221B of the logic test block 480 is at a low logic level: the signal on the scan-out output line 221C of the logic test block 481 is at a high logic level; and the signals from the remaining logic test boocks are still unknown. At the time $t_6$, the signal on the scan-in input line 220B to the logic test block 480 is switched to a high logic level and then a clock pulse is supplied to each of the logic test blocks for the period $t_7$-$t_8$.

At $t_8$, the signal on the scan-out output line 221B of the logic test block 480 is at a high logic level; the signal on the scan-out output line 221C of the logic test block 481 is at a low logic level; the signal on the scan-out output line 221D of the logic test block 482 is at a high logic level, and the signal on the scan-out output line 221E of the logic test block 483 is still unknown. Another clock pulse is supplied to each logic test block for the period $t_9$-$t_{10}$. At $t_{10}$ the signal on the scan-out output line 221B of the logic test block 480 is at a high logic level; the signal on the scan-out output line 221C of the logic test block 481 is at a high logic level; the signal on the scan-out output line 221D of the logic test block 482 is at a low logic level; and the signal on the scan-out output line 221E of the logic test block 483 is at a high logic level.

Thus, a desired test vector is entered in the logic test blocks 480–483. To demonstrate that the shift register is working correctly, the signal on the scan-in input line 220B of the logic test block 480 is switched to a low logic level and then additional clock pulses supplied to the logic test blocks 480–484. After each additional clock pulse, a bit of the test vector is shifted to the scan-out output line 221F of the logic test block 484. If the correct signal is measured after each clock pulse and the output on the output line 211F of the logic test block 484 does not change, then the shift register is functioning correctly. To complete the scan test the sequence of signals shown in FIG. 6b is repeated to reload the test vector into the logic test blocks 480–483.

To transfer the test vector from the latches to the output lines of the logic test blocks, the logic test blocks must be switched from the scan mode to the test mode. To change from the scan mode to the test mode, the signal $X_o$ on the control line 330 in FIG. 5 is switched to a low signal and the signal on the control line 311 is switched to a high level. With this change of signals, the gate of the pass transistor 302 is at a low level and the pass transistor 302 no longer passes the signal on the input line 210A to the output line 211A. The high signal on the gate of pass transistor 308 passes the signal on the latch output line 274 to the output line 211A.

Thus, when the signals on the control lines to the logic test blocks in FIG. 6a are switched to the test mode, the signal which was loaded into each logic test block 480–483 during the scan mode is available on both the scan-output lines 221B, 221C, 221D, 221E and the output lines 211B, 211C, 211D, 211E. Since the logic test block output lines 211B, 211C, 211D, 211E are the input lines 440–443 of the combinational logic block 445, the switch to the test mode applies the test vector to the combinational logic block 445. The result of the function performed by the combinational logic block 445 is represented by the signal on the output line 444 which is the input line 210F of the logic test block 484.

To ascertain the signal on the input line 210F of the logic test block 484, the block must be switched to the data receive mode. To change to the data receive mode, the signal on the control line 320 in FIG. 5 is switched to a low signal and the signal on the control line 310 is switched to a high signal. Now, the gate of the pass transistor 303 is at a low level and pass transistor 303 no longer passes the signal on the scan-in input line 220A to the latch input line 263. However, the gate of the pass transistor 301 is high and the pass transistor 301 passes the signal on the input line 210A to the input line 263 of the latch 260.

Thus, in FIG. 6a the signal on the input line 210F of the logic test block 484 is passed to the input line of the logic test block's latch by switching to the data receive mode. Next, a clock pulse is applied on the scan clock input line 222F of the logic test block 484 to load the signal into the block 484 and consequently onto the output line 221F, where the signal may be measured to determine the functionality of the combinational logic block 445.

In addition to isolating the CLB 445 and providing a scan testing capability of CLB 445, the logic test block arrangement in FIG. 6a provides a real time test capability for any of the lines associated with CLB 445. For example, assume that a user wants to determine the signal on primary input line 210C to the logic test block 481 at certain times during normal operation of the circuit. This is accomplished by providing a high signal on line 310C and a low signal on line 320C of the logic test block 481. Note that the line numbers here are designated by reference numerals corresponding to the reference numerals of FIG. 5, but the numbers have a suffix letter the FIG. 6a. This signal change isolates the scan-in input line 220C, but it connects the input line 210C to the latch 260C input line 263C (see corresponding input line 263 in FIG. 5) of the logic test block 481. A clock pulse on line 222C at the time of interest to the user will load the signal on line 210C into the logic test block's latches.

To determine the signal stored in the logic test block 481, a series of additional clock pulses is applied to the logic test blocks. These pulses shift the stored signal to the output line 221F of logic test block 484 where it may be measured. The shifting of data out of logic test block 481 and through the other logic test blocks will not interrupt the normal operation of the CLB 445 or the associated logic test blocks because in the normal mode of operation the normal signal path through the logic test block is isolated from the shift register path. Hence, by modifying the signals on lines 310 and 320 of a specified logic test block the user may monitor the normal signal in that logic test block by applying a sequence of clock pulses to the logic test blocks.

In the scan test both, the functionality of the scan test circuitry of the logic test blocks and the functionality of the combinational logic blocks are verified. Moreover a novel feature of the logic test block is that the scan test verifies the integrity of the pass transistor 302 in FIG. 5 even though the pass transistor 302 is not actually utilized during the scan test. To accomplish this verification a novel layout of the pass transistor 302 is used.

Figure 7:
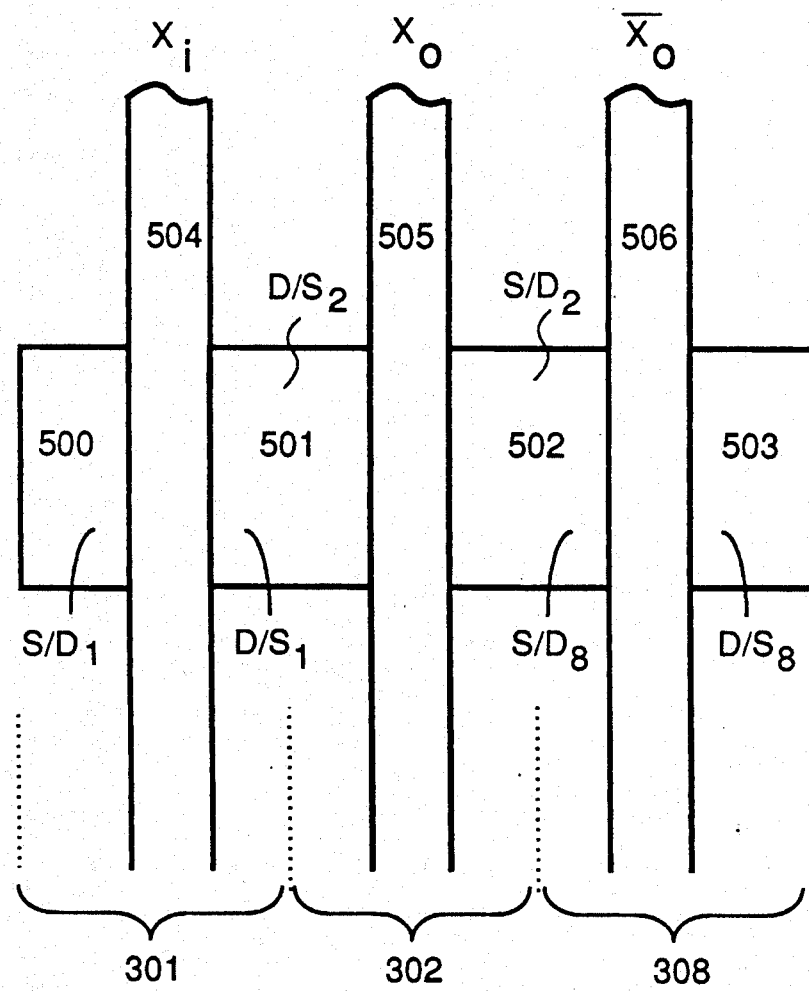
FIG. 7 illustrates a novel layout of pass transistors in the logic test block of this invention which permits 100% testing for operability of the logic test block.

The layout 500 of the pass transistors 301, 302, 308 in FIG. 5 is shown in FIG. 7. The diffusion region 501 for the drain/source $D/S_2$ of the pass transistor 302 is the same as the diffusion region for the drain/source $D/S_1$ of the pass transistor 301. The diffusion region 502 for the source/drain $S/D_2$ of the pass transistor 302 is the same diffusion region as the drain/source $D/S_8$ of the pass transistor 308. Since the pass transistor 301 and the pass transistor 308 are tested during scan testing, any defects in the diffusion region 501 or in the diffusion region 502 would be detected during the scan testing.

A line 505 forms the gate for the pass transistor 302 and supplies output control signal $X_o$ to the test block. If this line 505 failed, then the pass transistor 302 would not pass a signal. The line 505 is serially connected to all the logic test blocks used in conjunction with a particular combinational logic circuit and a means is provided at the end of its path for checking the voltage level on the line. Hence, if the line 505 is open at any point on the serial line, the failure is detected by measuring the voltage at the end of the line 505. The only other failure mode for the pass transistor 302 is a short. In this case a contention or possible defect would be detected in the scan test and even though a contention was not detected the logic test block would still work in normal operation.

Figure 8:
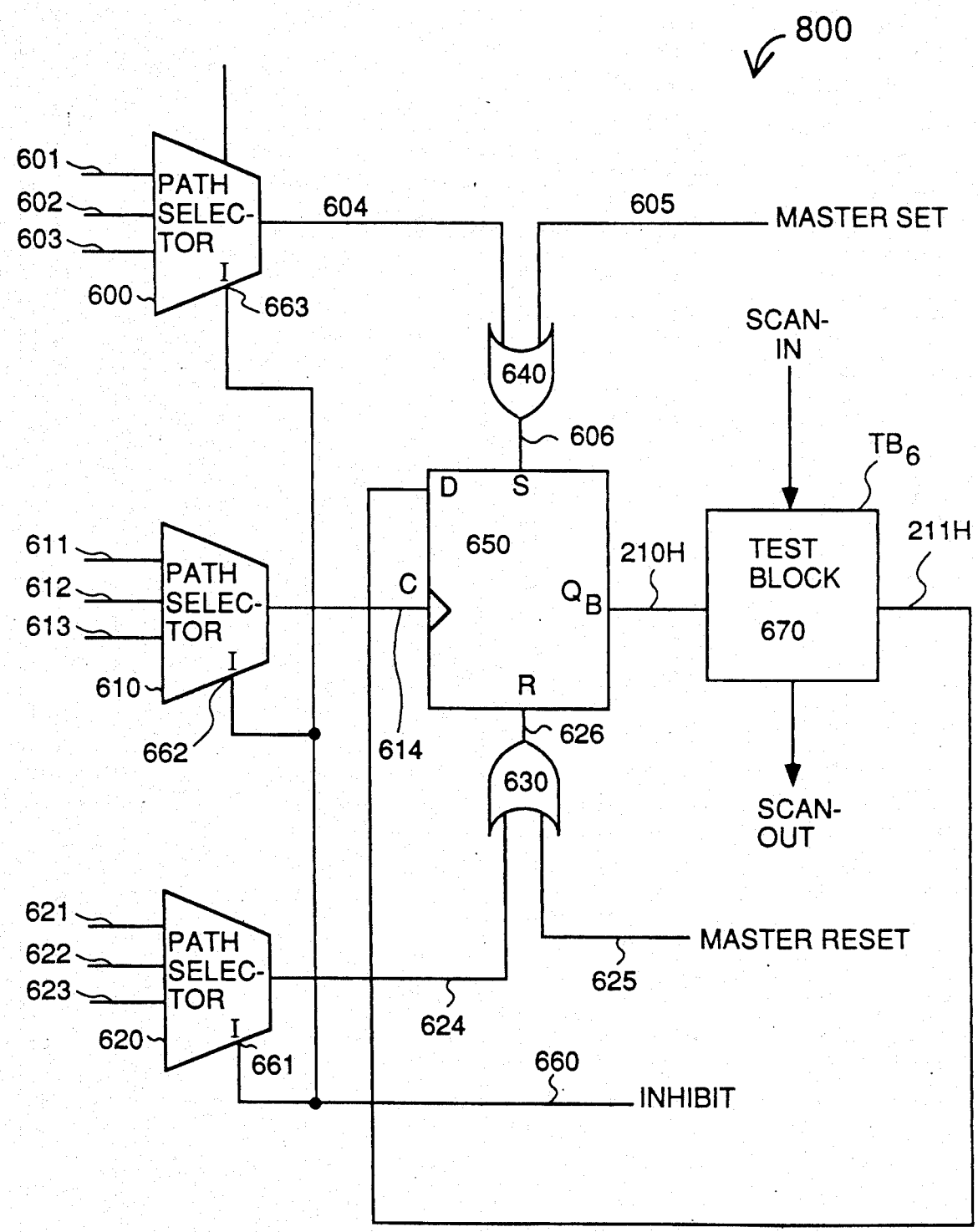
FIG. 8 illustrates the use of the novel scan logic test block in a flip-flop circuit with a feedback loop.

Another application of the novel logic test block is shown in FIG. 8. The logic test block 670 in FIG. 8 is identical to the logic test block in FIG. 5, but only the primary input line 210H and the test block output line 211H are shown. The other components and electrical leads which are shown in FIG. 5, but not shown in FIG. 8 for the purpose of convenience and clarity, will be designated by reference numerals corresponding to the reference numerals of FIG. 5, but will have a suffix letter "H". In FIG. 8, a first user-definable path selector 600 has three input lines 601–603 and an output line 604 which is connected to a first input terminal of a first OR gate connected to the master set line 605. The output line 606 of the OR gate 640 is connected to the set terminal S of the flip-flop 650. A second user-definable path selector 610 has three input lines 611–613 and an output line 614 which is connected to the clock terminal C of the flip-flop 650. A third user-definable path selector 620 has three input lines 621–623 and an output line 624 which is connected to a first input terminal of a second OR gate 630. The master reset line 625 is connected to the second input terminal of the OR gate 630. The output line 626 of the OR gate 630 is connected to the reset terminal R of the flip-flop 650. The output terminal QB of the flip-flop 650 is connected to the input line 210H of the logic test block 670. The output line 211H of the logic test block 670 is connected to the input terminal D of the flip-flop 650. Thus, the logic test block 670 is coupled in a feedback path coupling the output terminal QB to the input terminal D of the flip-flop 650.

If the logic test block 670 is set in the test mode, i.e., a low signal is applied on the control line 330H to the logic test block 670 and a high signal is applied on the control line 311H to the logic test block 670, then the signal on the input line 210H is no longer passed through the pass transistor 302H to the test block output line 211H. Rather, the output of the second latch 270H is passed through pass transistor 308H to the output line 211H. Thus, in this configuration, the logic test block is used to break the feedback path. This allows total control of the flip-flop 650, that is, the next state of the flip-flop 650 does not depend upon the previous state, but only upon the signal stored in the logic test block 670. When testing flip-flops the clock, set and reset signals to the flip-flops are inhibited when scanning data into the logic test block. Thus, an inhibit line 660 is connected to the inhibit terminal 661 of the user-definable path selector 620, to the inhibit terminal 662 of the user-definable path selector 610 and the inhibit terminal 663 of the user-definable path selector 600. This assures that the signals from the user-selectable paths may be inhibited while data is scanned into any of the logic test blocks that provide a stimulus to those paths.

Figure 9:
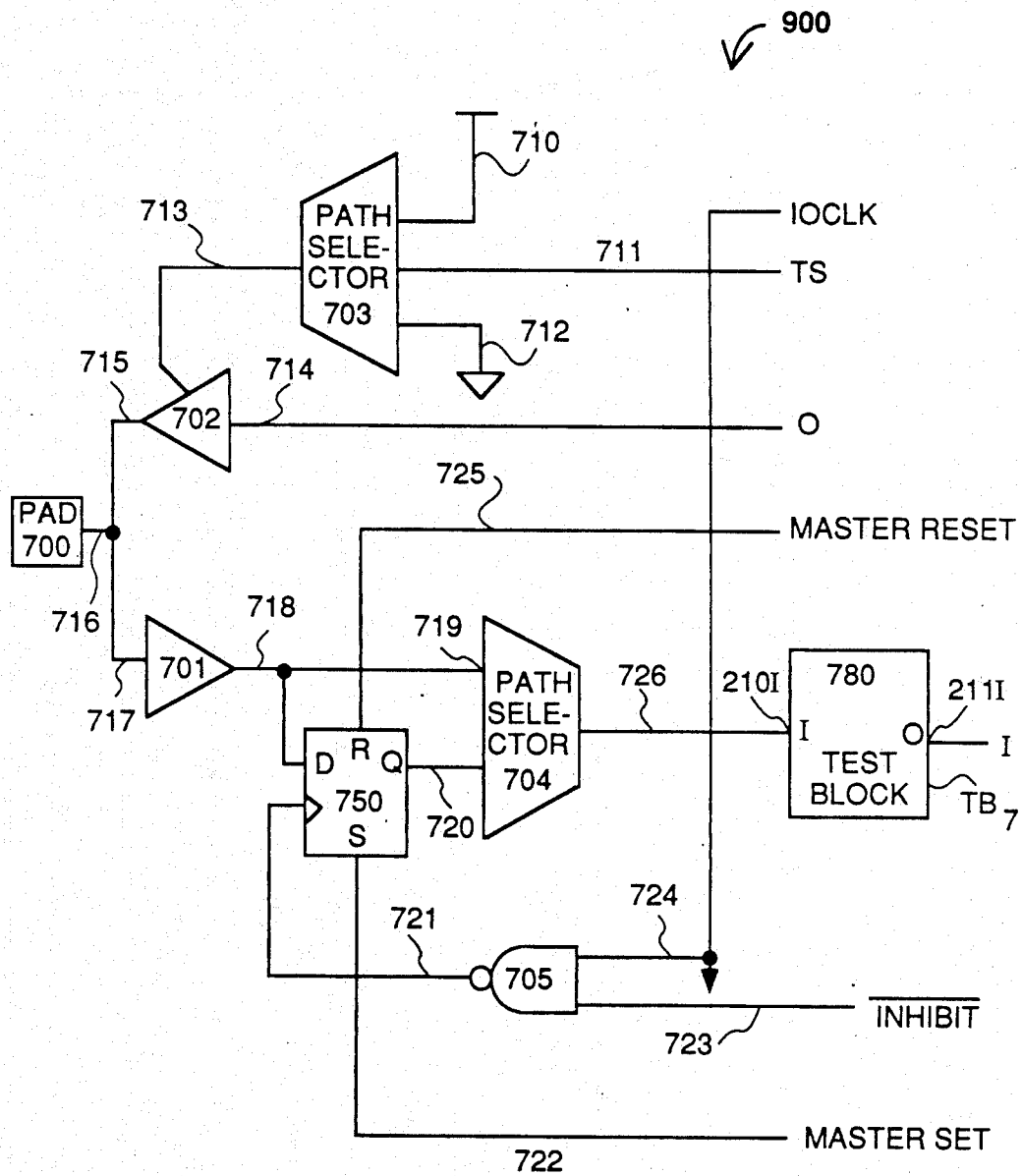
FIG. 9 illustrates the use of the novel scan logic test block in testing of the input/output circuitry of an integrated circuit.

In addition to using the logic test block in scan testing of combinational logic circuits and in feedback paths, the logic test block may also be used in any circuit where it is desired to determine the level of logic signals or provide stimuli in the circuit. For example, in FIG. 9 a logic test block 780 is incorporated in a user-configurable input/output (I/0) block 900. The I/0 block 900 in FIG. 9 includes a pin/pad 700 having an input/output line 716 that connects to the input line 717 of an input buffer 701. The output line 718 of the input buffer 701 is connected to the input terminal D of a flip-flop 750 and to the first input line 719 of a first user-definable path selector 704. The output terminal Q of the flip-flop 750 is connected to the second input line 720 to the user-definable path selector 704. The output line 726 of the user-definable path selector 704 is connected to the input line 210I of the logic test block 780. The line 716 is also connected to the output line 715 of the output buffer 702. The input terminal of the output buffer 702 is connected to the line 714. The master reset line 725 is connected to the reset terminal R of the flip-flop 750. The master set line 722 is connected to the set terminal S of the flip-flop 750. The input/output clock line 724 is connected to a first input terminal of the NAND gate 705. The line 723 which carries the complement of the inhibit signal is connected to the second input terminal of the NAND gate 705. The output line 721 from the NAND gate 705 is connected to the clock terminal of the flip-flop 750.

The input line 210I of the logic test block 780 reflects the status of the I/0 pin 700 or the contents of the input flip-flop 750. If the flip-flop 750 is selected by the user-definable path selector 704, then data present on the I/0 pin 700 will be clocked to the input line 210I by the I/0 clock signal on line 724. The output buffer 702 may be enabled, disabled, or under the control of the three-state connection at the path selector 703. Using the scan test and procedures with respect to the logic test block 780 the signal on the I/0 pin 700 may be ascertained. During testing while scanning data into and out of the logic test block 780, the clock to the flip-flop 750 is inhibited by NAND gate 705.

The logic test block of my invention provides a means for testing 100% of the functionality of a wide variety of circuits which process logic signals. The logic test block is transparent to the circuit in which it is contained during normal operation of the circuit. Further, the logic test block can be configured to permit normal operation of the circuit containing it and simultaneously provide a means for real time measurement of logic signals passing through the logic test block. Finally, the novel design of the logic test block and the layout of its components permits verification of the operability of each component in the logic test block.

What is claimed is:
1. A semiconductor device comprising:
   flip-flop means, having an input terminal and an output terminal, for storing digital information; and
   test block means, having a primary input terminal coupled to said output terminal of the flip-flop means, a primary output terminal coupled to said input terminal of the flip-flop means, a scan-in terminal for receiving digital signals from a serial scan path and a scan-out terminal for outputting digital signals to the serial scan path;

wherein the test block means includes first switching means for selectively and a synchronously coupling said primary input terminal to said primary output terminal to thereby form a breakable feedback path for a synchronously conducting signals from the output terminal of the flip-flop means to the input terminal of the flip-flop means, the first switching means being switchable among signal conducting and signal blocking states, and the first switching means being structured such that the integrity of one or more major components therein, responsible for allowing signals to pass through the first switching means, may be verified while the first switching means is in a signal blocking state; and switch control means operatively coupled to the first switching means for selectively breaking open said breakable feedback path.

2. A semiconductor device as defined in claim 1 wherein said first switching means comprises as a maro component thereof:

a first pass transistor having a drain coupled to the primary input terminal and a source coupled to the primary output terminal, said first pass transistor further having an elongated gate electrode with first and second ends spaced apart form the source and drain of the first pass transistor, the ends being arranged to allow a test signal to be passed form the first end to the second end of the elongated gate electrode to verify the integrity of the elongated gate electrode.

3. A semiconductor device as defined in claim 1 wherein the test block means further includes second and third switching means and a data storage means, the data storage means being provided with an input lead and an output lead, the second switching means being operatively coupled to selectively connect the primary input terminal to the input read of the data storage means, the third switching means being operatively coupled to selectively connect the output lead of the data storage means to the primary output terminal.

4. A semiconductor device as in claim 3 wherein said switch control means supplies complementary control signals to the first and third switching means to that said first switching means conducts a signal when said third switching means is open, and said third switching means conductors a signal when said first switching means is open.

5. A semiconductor deviced as in claim 3 further comprising a fourth switching means operatively coupled between the scan-in terminal and the input lead of the data storage means, wherein complementary control signals are supplied to the second and fourth switching means so that the second switching means conducts a signal when said fourth switching means is open, and said fourth switching means conducts a signal when said second switching means is open.

6. A semiconductor device as in claim 5 wherein said first switching means comprises a first pass transistor, said second switching means comprises a second pass transistor, said third swithing means comprises a third pass transistor, and said fourth switching means comprises a fourth pass transistor.

7. A semiconductor device as in claim 6 wherein
the first and second pass transistors share a common diffusion region functioning as the drain of both the first and second pass transistors, and
wherein the first and third pass transistor share a second common diffusion region serving as the source of both the first and third pass transistor.

8. The semiconductor device of claim 7 wherein the first pass transistor includes an elongated electrode having first and second ends
the device further comprising integrity verifying means for applying a test signal to the first end and measuring the signal at the second end of the gate electrode to thereby verify the integrity of the gate electrode of said first pass transistor.

9. A scan-testable circuit comprising:
flip-flop means for storing first digital data, the flip-flop means having a data input terminal for receiving input data, a data output terminal for outputting said first digital data, a set terminal for placing the flip-flop means in a set state and a reset terminal for placing the flip-flop mean in a reset state; and
test block means for testing the flip-flop means, the test block means having a primary input terminal coupled to the data output terminal of the flip-flop means, a primary output terminal coupled to the input terminal of the flip-flop means, a scan input terminal for receiving test data from a serial scan path and a scan output terminal for spending second digital data to the serial scan path, the second digital data including data received from the data output terminal of the flip-flop means.

10. A scan-testable circuit according to claim 9 further comprising:
first OR gate means for performing a first logical OR operation on a master RESET signal and a first selected signal and for supplying the result of said first OR operation to the reset terminal of the flip-flop means; and
second OR gate means for performing a second logical OR operation on a master SET signal and a second selected signal and for supplying the result of said second OR operation to the set terminal of the flip-flop means.

* * * * *

UNITED STATES PATENT AND TRADEMARK OFFICE
CERTIFICATE OF CORRECTION

PATENT NO. : 5,047,710

DATED : September 10, 1991

INVENTOR(S) : John E. Mahoney

It is certified that error appears in the above-identified patent and that said Letters Patent is hereby corrected as shown below:

Col. 1, lines 7-9 "This said Division of the U.S. application Ser. No. 97/106,750 field Oct. 10, 1987, now U.s. Pat. No. 4,855,669" should read --This is a Division of U.S. applicaton Ser. No. 07/106,750 filed Oct. 7, 1987, now U.S. Pat. No. 4,855,669--.

Col. 5, line 21, "on a s" should read --only a single--.

Col. 5, line 26, after "test" insert --block--.

Col. 5, line 28, after "embodiment" insert --of a scan logic test block, made in accordance with this--.

Col. 5, line 39, "in a" should read --in testing a--.

Col. 8, line 24, "online" should read --on line--.

Col. 8, line 38, "D/$S_4$of" should read --D/$S_4$ of--.

Col. 11, line 37, "(TB0 through TB4)" should read --(TB$_0$ through TB$_4$)--.

Col. 11, line 51, "11B" should read --211B--.

Col. 14, line 32, after "letter" insert --corresponding to the suffix used for the logic test block in--.

Col. 15, line 31, after "gate" insert --640. The second input terminal of the OR gate 640 is--.

Col. 17, lines 4 and 7, "a synchronously" should read --asynchronously--.

UNITED STATES PATENT AND TRADEMARK OFFICE
CERTIFICATE OF CORRECTION

PATENT NO. : 5,047,710

DATED : September 10, 1991

INVENTOR(S) : John E. Mahoney

It is certified that error appears in the above-identified patent and that said Letters Patent is hereby corrected as shown below:

Col. 17, line 22, "maro" should read --major--.

Col. 17, line 30, "form" should read --from--.

Col. 17, line 41, "read" should read --lead--.

Col. 17, line 50, "conductors" should read --conducts--.

Col. 17, line 47, "means to that" should read --means so that--.

Col. 18, line 40, "spending" should read --sending--.

Signed and Sealed this

Fifth Day of October, 1993

Attest:

BRUCE LEHMAN

Attesting Officer

Commissioner of Patents and Trademarks